United States Patent
Song et al.

(10) Patent No.: US 9,595,975 B1
(45) Date of Patent: Mar. 14, 2017

(54) LOW-LATENCY HIGH-GAIN CURRENT-MODE LOGIC SLICER

(71) Applicant: SAMSUNG DISPLAY CO., LTD., Yongin, Gyeonggi-Do (KR)

(72) Inventors: Sanquan Song, Mountain View, CA (US); Amir Amirkhany, Sunnyvale, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/144,521

(22) Filed: May 2, 2016

Related U.S. Application Data

(60) Provisional application No. 62/234,882, filed on Sep. 30, 2015.

(51) Int. Cl.
*H03H 7/40* (2006.01)
*H03M 1/12* (2006.01)
*H03K 19/0944* (2006.01)

(52) U.S. Cl.
CPC .......... *H03M 1/12* (2013.01); *H03K 19/0944* (2013.01)

(58) Field of Classification Search
CPC .... H03M 1/12; H03M 13/15; H03M 13/2707; H03M 13/2721; H03M 13/2906; H03M 13/2918; H03M 13/2917; H03M 13/3746; H03K 19/0944; H03K 3/356; H03K 5/135; H03K 5/1515; H04L 25/067; H04L 25/35; H04L 25/061; H04L 25/03057; H04L 25/03146; H04L 25/03006; H04L 25/03267; H03H 7/40

USPC .... 375/233, 319, 308, 239, 350; 326/27, 68, 326/81
See application file for complete search history.

(56) References Cited

U.S. PATENT DOCUMENTS

| | | | |
|---|---|---|---|
| 5,977,798 A * | 11/1999 | Zerbe | H03K 3/356121 |
| | | | 326/115 |
| 7,184,478 B2 * | 2/2007 | Popescu | H03H 15/00 |
| | | | 375/229 |
| 7,598,788 B2 | 10/2009 | Cao | |
| 7,646,323 B2 | 1/2010 | Pickering | |
| 7,822,114 B2 | 10/2010 | Bulzacchelli et al. | |
| 8,126,045 B2 | 2/2012 | Bulzacchelli et al. | |
| 8,477,833 B2 | 7/2013 | Bulzacchelli et al. | |

(Continued)

OTHER PUBLICATIONS

Han, et al.; ResearchGate; A 60Gb/s 173mW Receiver Frontend in 65nm CMOS Technology; Conference Paper Jun. 2015; 3 Sheets.

(Continued)

*Primary Examiner* — Lam T Mai
(74) *Attorney, Agent, or Firm* — Lewis Roca Rothgerber Christie, LLP

(57) ABSTRACT

A low-latency, high-gain (LLHG) slicer includes an input stage coupled to a differential output port and configured to receive a differential analog input signal, and to track the differential analog input signal during a tracking phase, an output stage coupled to the differential output port and configured to generate digital output bits corresponding to the differential analog input signal during a regeneration phase, and a tunable resistor coupled to the differential output port and configured to provide a first load impedance during the tracking phase and to provide a second load impedance during the regeneration phase, the first load impedance being lower than the second load impedance.

20 Claims, 4 Drawing Sheets

(56) References Cited

U.S. PATENT DOCUMENTS

| | | | |
|---|---|---|---|
| 8,749,269 B2 | 6/2014 | Cao | |
| 8,751,910 B2* | 6/2014 | Farhoodfar | H03M 13/15 |
| | | | 714/782 |
| 9,215,114 B2* | 12/2015 | Emami-Neyestanak | H04L 25/061 |
| 2004/0258183 A1 | 12/2004 | Popescu et al. | |
| 2009/0208758 A1* | 8/2009 | D'Herbecourt | C09J 5/02 |
| | | | 428/423.1 |
| 2010/0009642 A1* | 1/2010 | Pratt | H03F 1/0244 |
| | | | 455/127.1 |
| 2013/0294546 A1 | 11/2013 | Emami-Neyestanak et al. | |
| 2014/0056344 A1 | 2/2014 | Dickson et al. | |

OTHER PUBLICATIONS

Han, J., et al., "A 60Gb/s 173mW Receiver Frontend in 65nm CMOS Technology," University of California, Berkeley, Jun. 2015, Sheets 1-2.

* cited by examiner

LOW-LATENCY HIGH-GAIN CURRENT-MODE LOGIC SLICER

CROSS-REFERENCE TO RELATED APPLICATION(S)

This application claims priority to, and the benefit of, U.S. Provisional Application No. 62/234,882, entitled "A Low-latency High-gain CML Slicer," filed on Sep. 30, 2015, the entire content of which is incorporated herein by reference.

FIELD

Aspects of the present invention relate to a current-mode logic slicer.

BACKGROUND

Current-mode logic (CML) slicers, which quantify analog input signals into digital output bits, have been widely adopted in receivers (e.g., serial/deserializer (SerDes) receivers). The CML slicer has two phases of operation: a tracking phase during which the CML slicer tracks the input signal (e.g., analog signal waveform) for a first half of a clock cycle, and a regeneration phase during which the CML slicer regenerates the analog input as a digital output during a second half of the clock cycle.

The operational demands placed on conventional CML slicers often result in conflicting requirements. For example, low tracking latency (i.e., high tracking bandwidth) is desired because it reduces the circuit-induced inter-symbol-interface (ISI), which is additive to channel induced ISI, and because lower tracking latency serves to close the timing paths where decision feedback equalization (DFE) is applied. To achieve low tracking latency, the load resistor needs to be sufficiently small. On the other hand, high regeneration gain is also desired so that the output of the CML slicer may be a wide-swing digital signal, which is more immune to noise and other non-ideality than an analog signal. To achieve high regeneration gain, the load resistor needs to be sufficiently large. Therefore, a trade-off exists between the tracking latency and the regeneration gain in conventional slicer designs.

Conventional solutions attempt to reach a compromise between the two requirements by selecting an output resistance that is small enough to satisfy a minimum tracking latency requirement, and is large enough to satisfy a minimum regeneration gain requirement. This, however, leads to sub-optimal design.

The above information disclosed in this Background section is only for enhancement of understanding of the invention, and therefore it may contain information that does not form the prior art that is already known to a person of ordinary skill in the art.

SUMMARY

Aspects of embodiments of the present invention are directed toward a low-latency, high-gain common-mode logic slicer (hereinafter, an LLHG slicer) utilizing a dynamically tuned load impedance to decouple the tracking latency and the regeneration gain of the LLHG slicer. According to some embodiments, in the tracking phase, a clocked complementary metal-oxide semiconductor (CMOS) device reduces the load impedance of the LLHG slicer, while in the regeneration phase, an active inductor device sets (e.g., increases) the load impedance. In some embodiments, the LLHG slicer utilizes low power diode-connected devices to bias the active inductor devices, which automatically compensates for process variation (e.g., transistor threshold variation) and results in power savings.

According to some exemplary embodiments of the invention, there is provided a low-latency, high-gain (LLHG) slicer including: an input stage coupled to a differential output port and configured to receive a differential analog input signal, and to track the differential analog input signal during a tracking phase; an output stage coupled to the differential output port and configured to generate digital output bits corresponding to the differential analog input signal during a regeneration phase; and a tunable resistor coupled to the differential output port and configured to provide a first load impedance during the tracking phase and to provide a second load impedance during the regeneration phase, the first load impedance being lower than the second load impedance.

In an embodiment, the tracking phase corresponds to a first half of a clock cycle, and the regeneration phase corresponds to a second half of the clock cycle.

In an embodiment, the LLHG slicer further includes a mode selector coupled to the input and output stages and configured to activate the input stage and deactivate the output stage during the tracking phase, and to deactivate the input stage and activate the output stage during the regeneration phase.

In an embodiment, the mode selector is further configured to receive a differential clock signal, a first half of a clock cycle of the differential clock signal corresponding to the tracking phase, and a second half of the clock cycle of the differential clock signal corresponding to the regeneration phase.

In an embodiment, the tunable resistor includes a clocked CMOS resistor configured to receive the differential clock signal, and to provide a third impedance during the tracking phase and to provide a fourth impedance during the regeneration phase, the third impedance being lower than the fourth impedance.

In an embodiment, the tunable resistor further includes an active inductor connected in parallel with clocked CMOS resistor and configured to provide a clock-independent impedance.

In an embodiment, the first load impedance is a cumulative resistance of the third impedance and the clock-independent impedance, and the second load impedance is a cumulative resistance of the fourth impedance and the clock-independent impedance.

According to some exemplary embodiments of the invention, there is provided a low-latency, high-gain (LLHG) slicer including: a current-mode logic (CML) differential transistor pair coupled to a differential output port and configured to receive a differential analog input signal, and to track the differential analog input signal when activated; a cross-coupled transistor pair coupled to the differential output port and configured to generate digital output bits corresponding to the differential analog input signal when activated; a clock-enable transistor pair configured to receive a differential clock signal, to activate the CML differential transistor pair and deactivate the cross-coupled transistor pair during a first half of a clock cycle of the differential clock signal, and to deactivate the CML differential transistor pair and activate the cross-coupled transistor pair during a second half of the clock cycle of the differential clock signal; and a tunable resistor coupled to the differential output port and configured to receive the differential clock signal, to provide a first load impedance during the first half of the clock cycle, and to provide a second load impedance during the second half of the clock cycle, the first load impedance being lower than the second load impedance.

In an embodiment, the differential clock signal includes a first clock signal and a second clock signal, the first and second clock signals being out of phase by 180 degrees, and the first half of the clock cycle corresponds to a period in time in which one of the first and second clock signals is at a logic high level, and the second half of the clock cycle corresponds to a subsequent period in time in which the one of the first and second clock signals is at a logic low level.

In an embodiment, the tunable resistor includes a clocked CMOS resistor, the clocked CMOS resistor including first and second output transistors coupled between a first voltage source and the differential output port, gate electrodes of the first and second output transistors receiving one of the first and second clock signals, and the first and second transistors are configured to provide a third impedance during the first half of the clock cycle and to provide a fourth impedance during the second half of the clock cycle, the third impedance being lower than the fourth impedance.

In an embodiment, the first and second output transistors include PMOS transistors, and the one of the first and second clock signals is the first clock signal.

In an embodiment, the first and second output transistors include NMOS transistors, and the one of the first and second clock signals is the second clock signal.

In an embodiment, the clocked CMOS resistor further includes first and second output resistors connected in parallel with respective ones of the first and second output transistors, the first and second output resistors having a set resistance.

In an embodiment, the tunable resistor includes a first active inductor, the first active inductor including: an active transistor coupled between a first voltage source and the differential output port; a diode-connected transistor coupled between a first electrode and a gate electrode of the active transistor; and a current source coupled to the active and diode-connected transistors, wherein the diode-connected transistor and the current source are configured to maintain the active transistor in an active state such that the first active inductor provides a clock-independent impedance throughout the first and second half of the clock cycle.

In an embodiment, the active state corresponds to a mode of operation at an edge of a linear region and a saturation region of the active transistor.

In an embodiment, the active and diode-connected transistors include PMOS transistors, and the CML differential transistor pair and the cross-coupled transistor pair include NMOS transistors.

In an embodiment, the active and diode-connected transistors include NMOS transistors, and the CML differential transistor pair and the cross-coupled transistor pair include PMOS transistors.

In an embodiment, the first active inductor further includes an output resistor connected in series with the active transistor, the output resistor having a set resistance.

In an embodiment, the tunable resistor further includes a second active inductor, the second active inductor being a same as the first active inductor.

According to some exemplary embodiments of the invention, there is provided a low-latency, high-gain slicer including: a current-mode logic (CML) differential transistor pair coupled to a differential output port and configured to receive a differential analog input signal, and to track the differential analog input signal when activated; a cross-coupled transistor pair coupled to the differential output port and configured to generate digital output bits corresponding to the differential analog input signal when activated; a clock-enable transistor pair configured to receive a differential clock signal, to activate the CML differential transistor pair and deactivate the cross-coupled transistor pair during a first half of a clock cycle of the differential clock signal, and to deactivate the CML differential transistor pair and activate the cross-coupled transistor pair during a second half of the clock cycle of the differential clock signal; and a tunable resistor coupled to the differential output port and including a clocked CMOS resistor and first and second active inductors, the tunable resistor being configured to receive the differential clock signal, to provide a first load impedance during the first half of the clock cycle, and to provide a second load impedance during the second half of the clock cycle, the first load impedance being lower than the second load impedance, wherein the clocked CMOS resistor includes first and second output transistors coupled between a first voltage source and the differential output port, gate electrodes of the first and second output transistors receiving the differential clock signal, wherein the first and second transistors are configured to provide a third impedance during the first half of the clock cycle and to provide a fourth impedance during the second half of the clock cycle, wherein each of the first active inductors including: an active transistor coupled between a first voltage source and the differential output port; a diode-connected transistor; and a current source, wherein the diode-connected transistor and the current source are configured to maintain the active transistor in an active state such that the first active inductor provides a clock-independent impedance throughout the first and second half of the clock cycle, and wherein the first load impedance is a cumulative resistance of the third impedance and the clock-independent impedance, and the second load impedance is a cumulative resistance of the fourth impedance and the clock-independent impedance.

BRIEF DESCRIPTION OF THE DRAWINGS

The above and other features and aspects of the invention will be made more apparent by the following detailed description of exemplary embodiments thereof with reference to the attached drawings, in which.

DETAILED DESCRIPTION

Figure 1A:
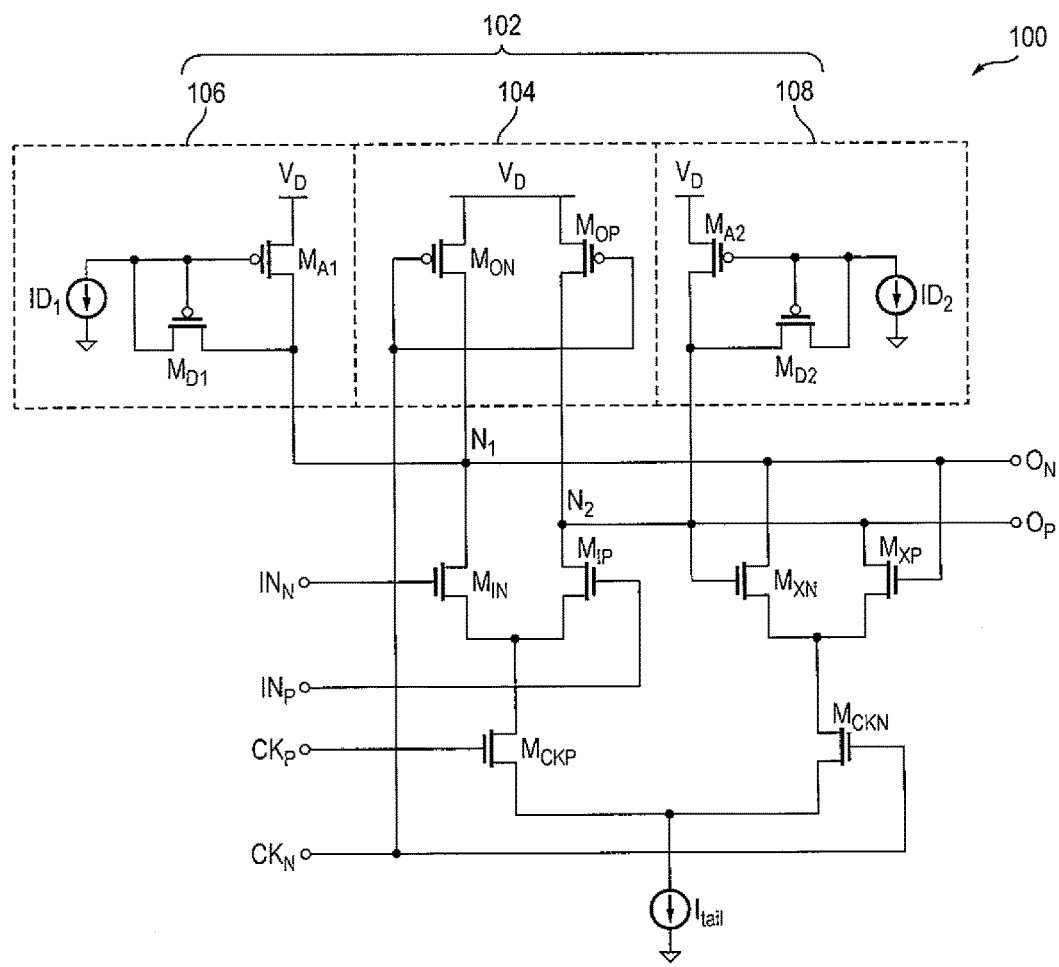
FIG. 1A is a schematic diagram of the low-latency, high-gain (LLHG) slicer according to some exemplary embodiments of the present invention.

The attached drawings for illustrating exemplary embodiments of the invention are referred to in order to provide a sufficient understanding of the invention, the merits thereof, and the objectives accomplished by the implementation of the invention. The invention may, however, be embodied in many different forms and should not be construed as being limited to the exemplary embodiments set forth herein; rather, these exemplary embodiments are provided so that this disclosure will be thorough and complete, and will fully convey the concept of the invention to those skilled in the art.

Hereinafter, the invention will be described in detail by explaining exemplary embodiments of the invention with reference to the attached drawings. In the drawings, like reference numerals are used throughout the figures to reference like features and components.

Aspects of embodiments of the present invention are directed to a low-latency, high-gain slicer that decouples its tracking latency from its regeneration gain by dynamically tuning the load impedance (e.g., the load resistance). According to some embodiments, the load impedance is tuned to a relatively low output impedance during the tracking phase and tuned to a relatively high output impedance during the regeneration phase. Clocked CMOS devices are utilized as dominant load resistors during the tracking phase, accelerating the tracking and minimizing the latency. Active inductor devices (including active devices, such as transistors), which exhibit relatively low impedance at low frequencies and relatively high impedance at high frequencies, are adopted as the dominant load impedance during the regeneration phase, sharpening the edge and boosting the regeneration gain. Furthermore, diode connected CMOS devices are adopted to bias the active inductor devices, which require small (e.g., minimum) DC current and compensate for the device's variations automatically.

Figure 1B:
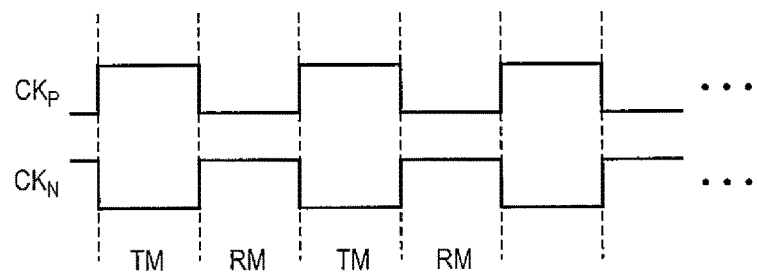
FIG. 1B illustrates a relation between the tracking and regeneration phases of the LLHG slicer and the waveforms of the differential clock signals input to the LLHG slicer, according to some exemplary embodiments of the present invention.

FIG. 1A is a schematic diagram of the low-latency, high-gain (LLHG) slicer 100 according to some exemplary embodiments of the present invention. FIG. 1B illustrates the relation between the tracking and regeneration phases of the LLHG slicer 100 and the waveforms of the differential clock signals (or the clock signals) $CK_P$ and $CK_N$ input to the LLHG slicer 100, according to some exemplary embodiments of the present invention.

Referring to FIGS. 1A-1B, the LLHG slicer 100 receives differential input signals $IN_N$ and $IN_P$ (also collectively referred to as a differential analog input signal), which represent an analog input waveform, and differential clock signals $CK_P$ and $CK_N$, which are used to control the operation modes of the LLHG slicer 100, and outputs differential output signals $O_N$ and $O_P$, which are in the form of digital bits (e.g., a bit stream) and correspond to the differential analog input signals $IN_N$ and $IN_P$. In some examples, the differential clock signals $CK_P$ and $CK_N$ may be logical inverses of one another (e.g., be out of phase by 180 degrees). For example, when the first clock signal $CK_P$ is at a logic high level, the second clock signal $CK_N$ is at a logic low level. The voltage levels of the logic high and logic low levels may be determined by the process technology used to fabricate the transistors of the LLHG slicer 100.

The differential input signals $IN_N$ and $IN_P$ are applied to the respective gate electrodes of the first and second input transistors $M_{IN}$ and $M_{IP}$, which constitute a current-mode logic (CML) differential transistor pair (also referred to as an input stage). In some embodiments, the first and second input transistors $M_{IN}$ and $M_{IP}$ are negative-channel metal-oxide (NMOS) transistors that are coupled together, and coupled to the first clock-enable transistor $M_{CKP}$, at their respective source electrodes.

The first and second input transistors $M_{IN}$ and $M_{IP}$ (e.g., their respective drain electrodes) may be coupled to a tunable resistor 102, which includes a clocked complementary metal-oxide semiconductor (CMOS) resistor 104, at output nodes $N_1$ and $N_2$ (that may be collectively referred to as differential output port). When activated, the first and second input transistors $M_{IN}$ and $M_{IP}$ (together with the tunable resistor 102) track the differential analog input signals $IN_N$ and $IN_P$. The clocked CMOS resistor 104 includes first and second output transistors $M_{ON}$ and $M_{OP}$. In some embodiments, the first and second output transistors $M_{ON}$ and $M_{OP}$ are positive-channel metal-oxide (PMOS) transistors that are coupled to a first voltage source $V_D$ at their respective drain electrodes, and are driven at their respective gate electrodes by the second clock signal $CK_N$. When activated/fully ON (e.g., when the second clock signal $CK_N$ is at a logic low level), each of the first and second output transistors $M_{ON}$ and $M_{OP}$ may operate in a linear region and may exhibit (e.g., provide) low resistance. On the other hand, when deactivated/fully OFF (e.g., when the second clock signal $CK_N$ is at a logic high level), each of the first and second output transistors $M_{ON}$ and $M_{OP}$ may operate in a sub-threshold region (e.g., a deep sub-threshold region) and may exhibit (e.g., provide) relatively high resistance. The first voltage source $V_D$ may supply a voltage that is at or greater than the voltage corresponding to the logic high level. The value and range of the first voltage source $V_D$ may depend on the process technology used. For example, the first voltage source $V_D$ may be about 1.8 V for a 180 nm process, and may be about 1.2 V for a 65 nm process.

The first and second cross-coupled transistors $M_{XN}$ and $M_{XP}$, which constitute a cross-coupled transistor pair (also referred to as an output stage), provide positive feedback and (together with the tunable resistor 102) generate digital output bits corresponding to the differential analog input signals $IN_N$ and $IN_P$ when activated. The first and second cross-coupled transistors $M_{XN}$ and $M_{XP}$ may be coupled to the tunable resistor 102 (e.g., the clocked CMOS resistor 104) at the output nodes $N_1$ and $N_2$. In some embodiments, the first and second cross-coupled transistors $M_{XN}$ and $M_{XP}$ are NMOS transistors that are coupled together, and coupled to the second clock-enable transistor $M_{CKN}$, at their respective source electrodes.

Referring to FIGS. 1A-1B, the differential clock signals $CK_P$ and $CK_N$ are applied to respective gate electrodes of the first and second clock-enable transistors $M_{CKP}$ and $M_{CKN}$ (collectively referred to as a clock-enable transistor pair or a mode selector), which activate/turn ON (by biasing) either the first and second input transistors $M_{IN}$ and $M_{IP}$ and the clocked CMOS resistor 104 (e.g., the first and second output transistors $M_{ON}$ and $M_{OP}$) or the first and second cross-coupled transistors $M_{XN}$ and $M_{XP}$ based on the logic levels of the differential clock signals $CK_P$ and $CK_N$. For example, in the first half clock cycle (i.e., the tracking phase TM) when the first clock signal $CK_P$ is at a logic high level and the second clock signal $CK_N$ is at a logic low level, the first and second input transistors $M_{IN}$ and $M_{IP}$ and the first and second output transistors $M_{ON}$ and $M_{OP}$ are activated/turned ON, while the first and second cross-coupled transistors $M_{XN}$ and $M_{XP}$ are deactivated/turned OFF. Further, in the second half clock cycle (i.e., the regeneration phase RM) when the first clock signal $CK_P$ is at a logic low level and the second clock signal $CK_N$ is at a logic high level, the first and second input transistors $M_{IN}$ and $M_{IP}$ and the first and second output transistors $M_{ON}$ and $M_{OP}$ are deactivated/turned OFF, while the first and second cross-coupled transistors $M_{XN}$ and $M_{XP}$ are activated/turned ON.

As a result, in the tracking phase TM, the output impedance (e.g., the output resistance) exhibited (e.g., provided) by the tunable resistor 102 is relatively low, and thus, the slicer tracking latency, which is determined by the output resistance and the output capacitors, is low relative to a conventional slicer using a constant load resistance. Additionally, in the regeneration phase RM, the output impedance (e.g., the output resistance) exhibited (e.g., provided) by the tunable resistor 102 is relatively high, and thus, the regeneration gain (and the output swing), which is substantially proportional to the output impedance, is high relative to the conventional slicer.

According to some embodiments of the present invention, the tunable resistor 102 further includes first and second active inductors 106 and 108 coupled to output nodes $N_1$ and $N_2$ and connected in parallel with clocked CMOS resistor 104, which allow the LLHG slicer 100 to achieve a faster swing slope during the regeneration phase RM due to their active inductance nature.

In some embodiments, the first active inductor 106 includes a first active transistor $M_{A1}$ coupled between the first voltage source $V_D$ and the first output node $N_1$, which provides a high impedance (e.g., high resistance or low transconductance) when activated (e.g., in an ON state). The impedance of the first active transistor $M_{A1}$ may be higher than (e.g., substantially higher than) the on-resistance of the output transistors $M_{ON}$ and $M_{OP}$, and may be lower than (e.g., substantially lower than) the resistance of the output transistors $M_{ON}$ and $M_{OP}$ in the deactivated/OFF state. The first active transistor $M_{A1}$ may be biased via a first current source $I_{D1}$ and a first diode-connected transistor $M_{D1}$ coupled between the source and gate electrodes of the first active transistor $M_{A1}$. As a result, the impedance (e.g., the transconductance $g_m$) of the first active transistor $M_{A1}$, which is determined by the difference between the gate-to-source voltage $V_{GS}$ and the threshold voltage $V_{TH}$ of the first active transistor $M_{A1}$, remains substantially constant during both the tracking and regeneration phases, and is not controlled by (e.g., affected by) the first and second clock signals $CK_P$ and $CK_N$. In some embodiments, the first and second active transistors $M_{A1}$ and $M_{A2}$ may be biased at the edge of the linear and saturation regions (e.g., such that $V_{GS}$ is substantially equal to $V_{TH}$). In some embodiments, the second active inductor 106 includes a second active transistor $M_{A2}$, a second diode-connected transistor $M_{D2}$, and a second current source $I_{D2}$, and is the same or substantially the same, in structure and operation, as the first active inductor 106.

In addition to maintaining the first and second active transistors $M_{A1}$ and $M_{A2}$ in an activated/ON state (e.g., near the edge of the linear region and the saturation region), the first and second diode-connected transistors $M_{D1}$ and $M_{D2}$ also automatically track, and compensate for, process variations (e.g., device threshold variations) in the first and second active transistors $M_{A1}$ and $M_{A2}$. In addition, the first and second diode-connected transistors $M_{D1}$ and $M_{D2}$ use a small amount of (e.g., minimal) biasing current from the first and second current sources $I_{D1}$ and $I_{D2}$, which reduces the overall power usage of the tunable resistor 102 (and hence, the LLHG slicer 100). The use of the diode-connected biasing scheme also reduces (e.g., substantially eliminates) the effects of bias current variation of the first and second current sources $I_{D1}$ and $I_{D2}$ on the impedance of the active inductors 106 and 108.

The first and second diode-connected transistors $M_{D1}$ and $M_{D2}$ and the first and second active transistors $M_{A1}$ and $M_{A2}$ may be PMOS transistors.

In some examples, the first and second active inductors 106 and 108 may be replaced with fixed (or set and clock-independent) resistors having the same or substantially the same resistance as the impedance (e.g., $1/g_m$) of the first and second active transistors $M_{A1}$ and $M_{A2}$. However, as the impedance of the resistors would be substantially constant across operating frequencies, the swing slope during the regeneration phase RM may be adversely affected, as compared to embodiments that include the active inductors 106 and 108. Further, doing so may increase the power usage and die area of the tunable resistor 102 and make it more susceptible to process variations, as compared to embodiments in which the tunable resistor 102 includes the active inductors 106 and 108.

In some embodiments, the LLHG slicer 100 utilizes a biasing current source $I_{tail}$ coupled to the clock-enable transistors $M_{CKN}$ and $M_{CKP}$ (e.g., their respective source electrodes) for biasing the circuit. The biasing current source $I_{tail}$ may include a CMOS circuit and/or include any other suitable circuit known to a person of ordinary skill in the art.

In some examples, the two constituent transistors of the following pairs of transistors are identical or substantially identical: the first and second input transistors $M_{IN}$ and $M_{IP}$, the first and second output transistors $M_{ON}$ and $M_{OP}$, the first and second cross-coupled transistors $M_{XN}$ and $M_{XP}$, the first and second clock-enable transistors $M_{CKN}$ and $M_{CKP}$, the first and second diode-connected transistors $M_{D1}$ and $M_{D2}$, and the first and second active transistors $M_{A1}$ and $M_{A2}$; however, embodiments of the present invention are not limited thereto.

As will be understood by a person of ordinary skill in the art, the exemplary embodiments illustrated by FIG. 1A may be modified by substituting NMOS transistors for the PMOS transistors, and vice versa. In such a case, the polarity of the voltages/signals applied to the gate electrodes of the aforementioned transistors may be reversed.

Figure 2A:
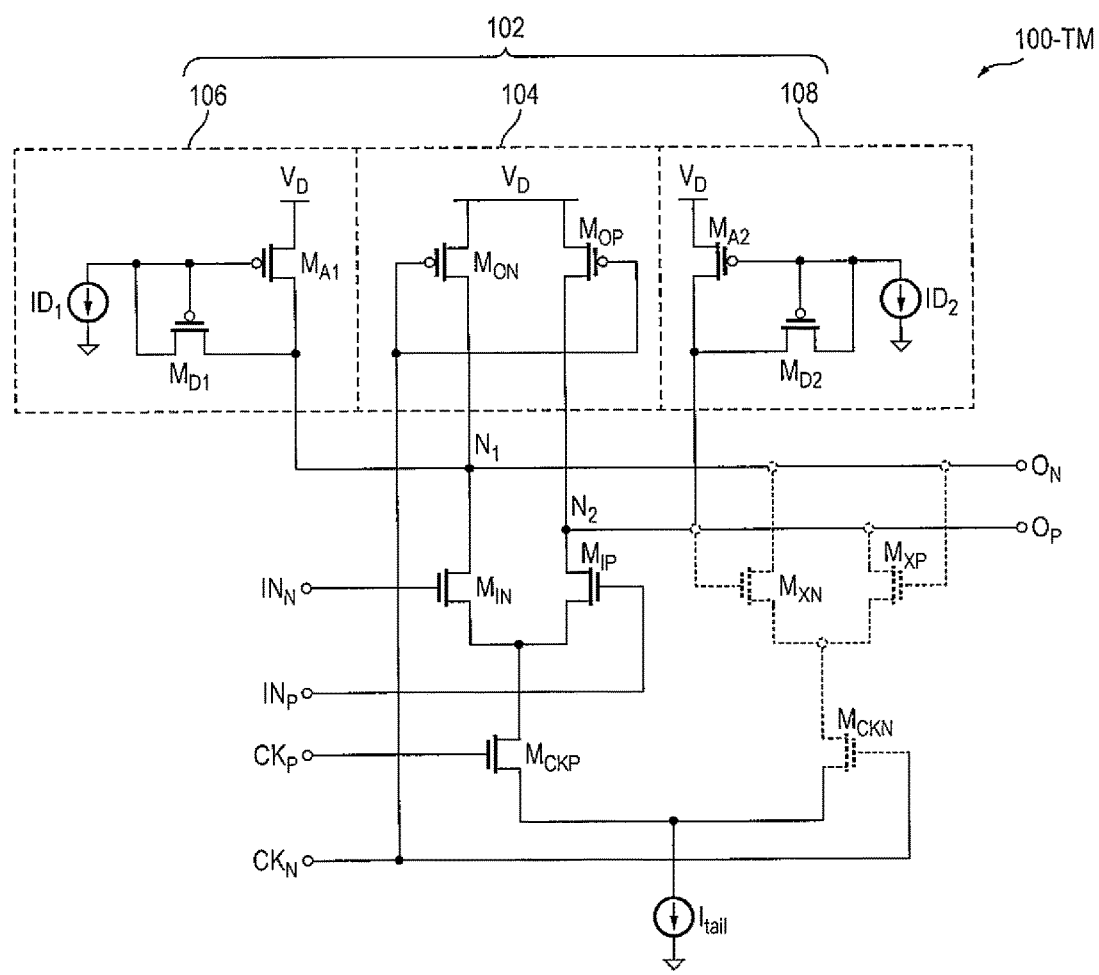
FIG. 2A illustrates the operation of the LLHG slicer in a tracking mode, according to some exemplary embodiments of the present invention.
Figure 2B:
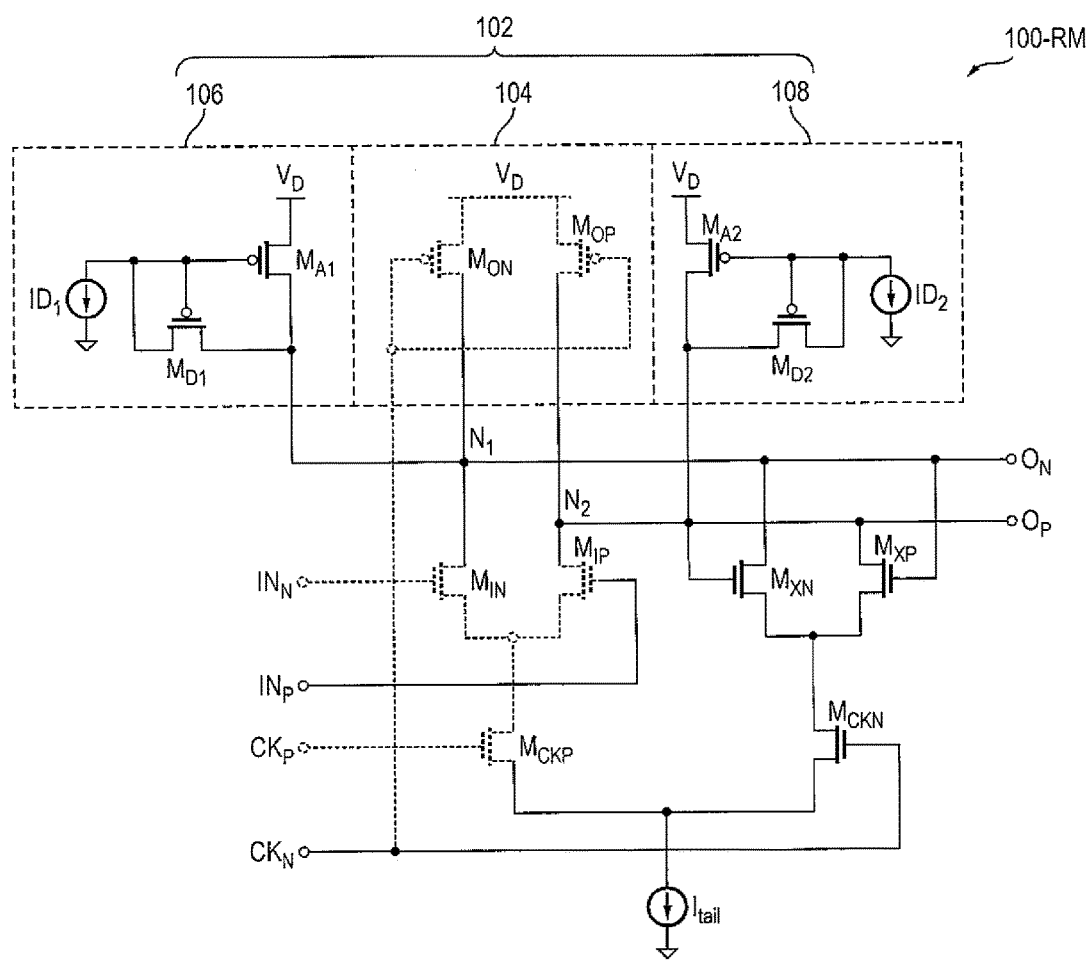
FIG. 2B illustrates the operation of the LLHG slicer in a regenerative mode, according to some exemplary embodiments of the present invention.

FIG. 2A illustrates the operation of the LLHG slicer 100-TM in a tracking mode, according to some exemplary embodiments of the present invention. FIG. 2B illustrates the operation of the LLHG slicer 100-RM in a regenerative mode, according to some exemplary embodiments of the present invention.

Referring to FIG. 2A, during the tracking phase TM (i.e., the first half clock cycle) when the first clock signal $CK_P$ is at a logic high level and the second clock signal $CK_N$ is at a logic low level, the input transistors $M_{IN}$ and $M_{IP}$ and the output transistors $M_{ON}$ and $M_{OP}$ are activated/turned ON, and the cross-coupled transistors $M_{XN}$ and $M_{XP}$ are deactivated/turned OFF. During this phase, the output transistors $M_{ON}$ and $M_{OP}$ operate in the linear region and exhibit (e.g., provide) a deterministic impedance (e.g., resistance) of about $1/g_{ds}$ (where $g_{ds}$ is the transconductance of the output transistors $M_{ON}$ and $M_{OP}$), which is lower than (e.g., substantially lower than) the impedance of the parallel active transistors $M_{A1}$ and $M_{A2}$. Thus, the effective load resistance (hereinafter also referred to as the first impedance) of the LLHG slicer 100 is low (e.g., about $1/g_{ds}$). The value of $1/g_{ds}$ may depend on the desired latency of the LLHG slicer 100, and in some examples may be from about 100 ohms to several hundred ohms at low operating frequencies, and several kilo-ohms at high frequencies.

As the tracking latency of the LLHG slicer 100 is determined by the effective load resistance and capacitance (i.e., the effective load impedance), the low load resistance (of, e.g., about $1/g_{ds}$) translates to the LLHG slicer having low tracking latency and high output bandwidth, both of which are desirable characteristics during the tracking phase TM.

In some examples, $1/g_{ds}$ may be about a quarter of the load resistance of comparable designs, as such, latency may be reduced by a factor of four relative to such comparable designs.

Referring to FIG. 2B, during the regeneration phase RM (i.e., the second half clock cycle) when the first clock signal $CK_P$ is at a logic low level and the second clock signal $CK_N$ is at a logic high level, the input transistors $M_{IN}$ and $M_{IP}$ and the output transistors $M_{ON}$ and $M_{OP}$ are deactivated/turned OFF, and the cross-coupled transistors $M_{XN}$ and $M_{XP}$ are activated/turned ON. During this phase, the output transistors $M_{ON}$ and $M_{OP}$ operate in the sub-threshold region (e.g., the deep sub-threshold region) and exhibit (e.g., provide) high impedance, which is greater than (e.g., substantially greater than) the impedance of the parallel active transistors $M_{A1}$ and $M_{A2}$. Thus, the resistance of the output transistors $M_{ON}$ and $M_{OP}$ is no longer dominant, and the effective load impedance of the LLHG slicer 100 (hereinafter also referred to as the second impedance) is substantially determined by the impedance (e.g., the transconductance $g_m$) of the active transistors $M_{A1}$ and $M_{A2}$.

As the effective DC gain (e.g., the effective DC regeneration gain) of the LLHG slicer 100 in the regeneration mode is substantially determined by the transconductance of the active transistors $M_{A1}$ and $M_{A2}$, which is set to be low, the LLHG slicer 100 may exhibit high effective DC gain, which is a desirable characteristic during the regeneration phase TM.

Further, the inductance exhibited (e.g., provided) by the active inductors 106 and 108 allows the LLHG slicer 100 to partially or substantially cancel, or compensate for, the effect of the equivalent capacitance on the output nodes $N_1$ and $N_2$, and thus sharpens the slope of (i.e., allows faster swings of) the differential output signals $O_N$ and $O_P$ relative to a conventional slicer utilizing fixed load resistors. In some examples, the impedance at high operating frequencies may be about four times that at low operating frequencies, which may result in a peaking of about 12 dB and sharpen the swing slope accordingly.

Accordingly, the dynamic load impedance of the tunable resistor 102 effectively decouples the delay of the tracking phase from the gain of the regeneration phase.

As described above, the tunable resistor 102 represents a bimodal load impedance that has a dynamically changing (e.g., a clocked) portion (e.g., the clocked CMOS resistor 104) and a fixed (e.g., a clock-independent) portion (e.g., the active inductors 106 and 108). As shown in FIGS. 1A-1B and 2A-2B, the load impedance of the LLHG slicer 100 is controlled by the same clock phases that control the tracking and regeneration modes.

Figure 3A:
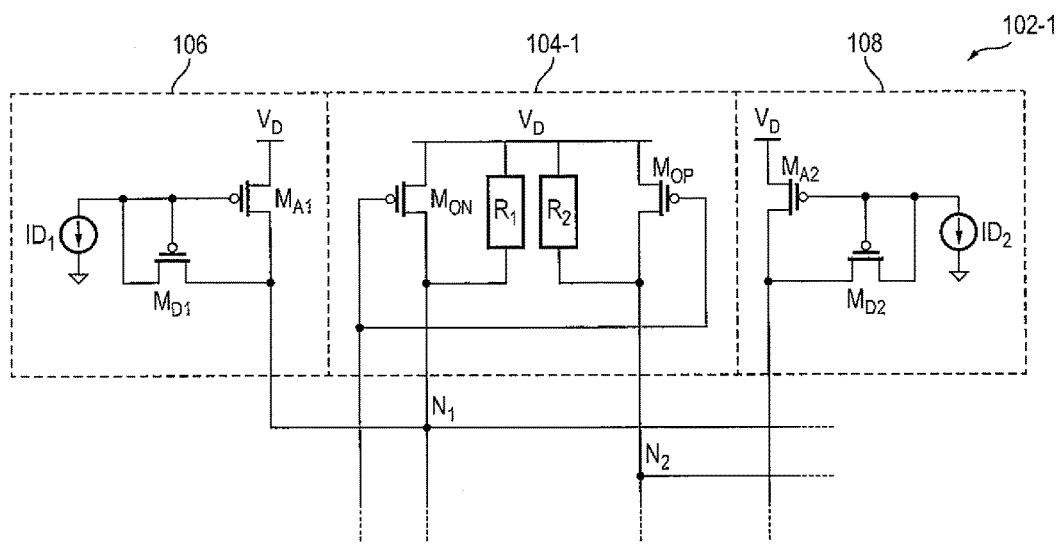
FIG. 3A illustrates the tunable resistor utilizing parallel-connected fixed resistors, according to some exemplary embodiments of the present invention.
Figure 3B:
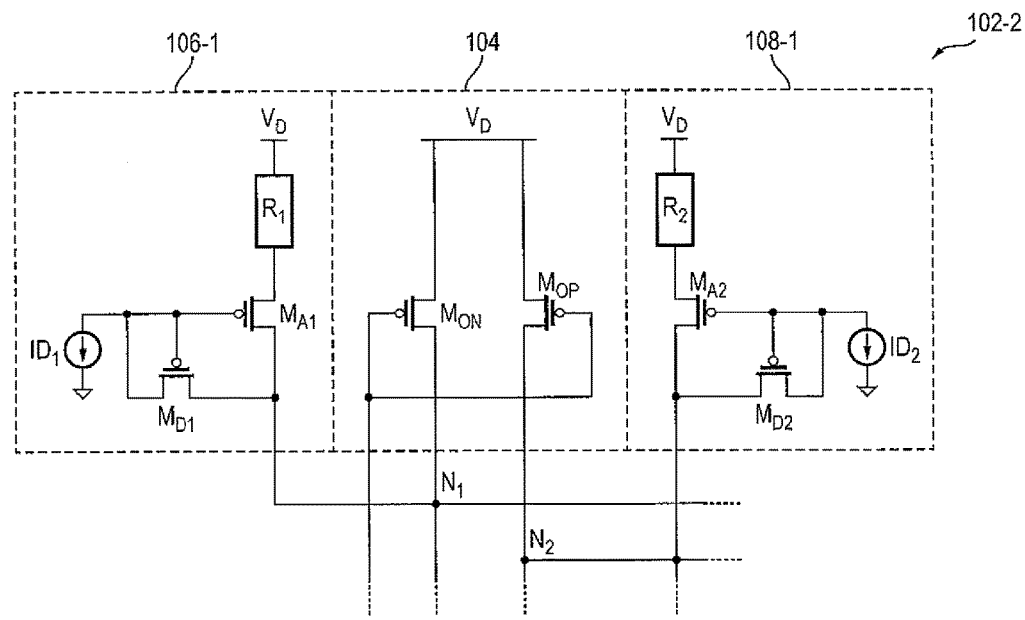
FIG. 3B illustrates the tunable resistor utilizing series-connected fixed resistors, according to some other exemplary embodiments of the present invention.

FIG. 3A illustrates the tunable resistor 102-1 utilizing parallel-connected fixed resistors, according to some exemplary embodiments of the present invention. FIG. 3B illustrates the tunable resistor 102-2 utilizing series-connected fixed resistors, according to some other exemplary embodiments of the present invention.

Referring to FIG. 3A, the tunable resistor 102-1, according to some embodiments, further includes first and second output resistors $R_1$ and $R_2$ respectively connected in parallel with the output transistors $M_{ON}$ and $M_{OP}$ and the active transistors $M_{A1}$ and $M_{A2}$. The first and second output resistors $R_1$ and $R_2$ have a fixed (e.g., set or clock independent) resistance.

Referring to FIG. 3B, the tunable resistor 102-2, according to some other embodiments, further includes the first and second output resistors $R_1$ and $R_2$ respectively connected in series with the active transistors $M_{A1}$ and $M_{A2}$. That is, the first and second output resistors $R_1$ and $R_2$ are coupled between the first voltage source $V_D$ and respective ones of the output nodes $N_1$ and $N_2$.

In some examples, series-connected resistors may be connected in series with the output transistors $M_{ON}$ and $M_{OP}$ in lieu of, or in addition to, the first and second output resistors $R_1$ and $R_2$ of the embodiments illustrated in FIGS. 3A-3B.

The parallel-connected (or series-connected) output resistors $R_1$ and $R_2$ (and any other additional fixed resistors) serve to modify (e.g., shift) the tunable resistance range of the tunable resistors 102-1 and 102-2.

Accordingly, the LLHG slicer, described through the above exemplary embodiments, decouples the tracking latency from the regeneration gain by adopting a dynamically tuned output resistance. Therefore, the LLHG slicer is capable of achieving both low latency and high gain.

Because the LLHG slicer, according to exemplary embodiments of the present invention, replaces the loading resistors of conventional designs with clocked CMOS devices, and because active inductors are made by CMOS devices without any resistor, the LLHG slicer may occupy a small (e.g., minimum) amount of die area, relative to conventional solutions. Further, the diode-connected devices of the LLHG slicer may automatically compensate for the process variations (e.g., transistor threshold variations and/or bias current variations) within the active inductor devices. Furthermore, as compared to conventional solutions, the diode-connected devices are low powered and use only a small amount (e.g., a minimum amount) of DC current to provide a voltage drop to bias the active inductor devices.

The LLHG slicer may be utilized in, for example, any serial link (e.g., high-speed serial link), such as a high-definition multimedia interface (HDMI) link, a universal serial bus (USB) link, a peripheral component interconnect (PCI) link, an Ethernet link, and/or the like. However, embodiments of the present invention are not limited thereto.

While this invention has been described in detail with particular references to illustrative embodiments thereof, the embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims and equivalents thereof.

It will be understood that, although the terms "first," "second," "third," etc., may be used herein to describe various elements, components, and/or sections, these elements, components, and/or sections should not be limited by these terms. These terms are used to distinguish one element, component, or section from another element, component, or section. Thus, a first element, component, or section discussed above could be termed a second element, component, or section, without departing from the spirit and scope of the invention.

It will also be understood that when an element is referred to as being "between" two elements, it can be the only element between the two elements, or one or more intervening elements may also be present.

The terminology used herein is for the purpose of describing particular embodiments and is not intended to be limiting of the invention. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Further, the use of "may" when describing embodiments of the invention refers to "one or more embodiments of the invention." Also, the term "exemplary" is intended to refer to an example or illustration.

It will be understood that when an element or component is referred to as being "connected to" or "coupled to" another element or component, it can be directly connected to or coupled to the other element or component, or one or more intervening elements or components may be present. When an element or layer is referred to as being "directly connected to" or "directly coupled to" another element or component, there are no intervening elements or components present.

As used herein, the terms "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

What is claimed is:

1. A low-latency, high-gain (LLHG) slicer comprising:
   an input stage coupled to a differential output port and configured to receive a differential analog input signal, and to track the differential analog input signal during a tracking phase;
   an output stage coupled to the differential output port and configured to generate digital output bits corresponding to the differential analog input signal during a regeneration phase; and
   a tunable resistor coupled to the differential output port and configured to provide a first load impedance during the tracking phase and to provide a second load impedance during the regeneration phase, the first load impedance being lower than the second load impedance.

2. The LLHG slicer of claim 1, wherein the tracking phase corresponds to a first half of a clock cycle, and the regeneration phase corresponds to a second half of the clock cycle.

3. The LLHG slicer of claim 1, further comprising a mode selector coupled to the input and output stages and configured to activate the input stage and deactivate the output stage during the tracking phase, and to deactivate the input stage and activate the output stage during the regeneration phase.

4. The LLHG slicer of claim 3, wherein the mode selector is further configured to receive a differential clock signal, a first half of a clock cycle of the differential clock signal corresponding to the tracking phase, and a second half of the clock cycle of the differential clock signal corresponding to the regeneration phase.

5. The LLHG slicer of claim 4, wherein the tunable resistor comprises a clocked CMOS resistor configured to receive the differential clock signal, and to provide a third impedance during the tracking phase and to provide a fourth impedance during the regeneration phase, the third impedance being lower than the fourth impedance.

6. The LLHG slicer of claim 5, wherein the tunable resistor further comprises an active inductor connected in parallel with clocked CMOS resistor and configured to provide a clock-independent impedance.

7. The LLHG slicer of claim 6, wherein the first load impedance is a cumulative resistance of the third impedance and the clock-independent impedance, and the second load impedance is a cumulative resistance of the fourth impedance and the clock-independent impedance.

8. A low-latency, high-gain (LLHG) slicer comprising:
   a current-mode logic (CML) differential transistor pair coupled to a differential output port and configured to receive a differential analog input signal, and to track the differential analog input signal when activated;
   a cross-coupled transistor pair coupled to the differential output port and configured to generate digital output bits corresponding to the differential analog input signal when activated;
   a clock-enable transistor pair configured to receive a differential clock signal, to activate the CML differential transistor pair and deactivate the cross-coupled transistor pair during a first half of a clock cycle of the differential clock signal, and to deactivate the CML differential transistor pair and activate the cross-coupled transistor pair during a second half of the clock cycle of the differential clock signal; and
   a tunable resistor coupled to the differential output port and configured to receive the differential clock signal, to provide a first load impedance during the first half of the clock cycle, and to provide a second load impedance during the second half of the clock cycle, the first load impedance being lower than the second load impedance.

9. The LLHG slicer of claim 8,
   wherein the differential clock signal comprises a first clock signal and a second clock signal, the first and second clock signals being out of phase by 180 degrees, and
   wherein the first half of the clock cycle corresponds to a period in time in which one of the first and second clock signals is at a logic high level, and the second half of the clock cycle corresponds to a subsequent period in time in which the one of the first and second clock signals is at a logic low level.

10. The LLHG slicer of claim 9,
    wherein the tunable resistor comprises a clocked CMOS resistor, the clocked CMOS resistor comprising first and second output transistors coupled between a first voltage source and the differential output port, gate electrodes of the first and second output transistors receiving one of the first and second clock signals, and
    wherein the first and second transistors are configured to provide a third impedance during the first half of the clock cycle and to provide a fourth impedance during the second half of the clock cycle, the third impedance being lower than the fourth impedance.

11. The LLHG slicer of claim 10, wherein the first and second output transistors comprise PMOS transistors, and the one of the first and second clock signals is the first clock signal.

12. The LLHG slicer of claim 10, wherein the first and second output transistors comprise NMOS transistors, and the one of the first and second clock signals is the second clock signal.

13. The LLHG slicer of claim 10, wherein the clocked CMOS resistor further comprises first and second output resistors connected in parallel with respective ones of the first and second output transistors, the first and second output resistors having a set resistance.

14. The LLHG slicer of claim 8, wherein the tunable resistor comprises a first active inductor, the first active inductor comprising:
   an active transistor coupled between a first voltage source and the differential output port;
   a diode-connected transistor coupled between a first electrode and a gate electrode of the active transistor; and
   a current source coupled to the active and diode-connected transistors,
   wherein the diode-connected transistor and the current source are configured to maintain the active transistor in an active state such that the first active inductor provides a clock-independent impedance throughout the first and second half of the clock cycle.

15. The LLHG slicer of claim 14, wherein the active state corresponds to a mode of operation at an edge of a linear region and a saturation region of the active transistor.

16. The LLHG slicer of claim 14,
   wherein the active and diode-connected transistors comprise PMOS transistors, and
   wherein the CML differential transistor pair and the cross-coupled transistor pair comprise NMOS transistors.

17. The LLHG slicer of claim 14,
   wherein the active and diode-connected transistors comprise NMOS transistors, and
   wherein the CML differential transistor pair and the cross-coupled transistor pair comprise PMOS transistors.

18. The LLHG slicer of claim 14, wherein the first active inductor further comprises an output resistor connected in series with the active transistor, the output resistor having a set resistance.

19. The LLHG slicer of claim 14, wherein the tunable resistor further comprises a second active inductor, the second active inductor being a same as the first active inductor.

20. A low-latency, high-gain slicer comprising:
   a current-mode logic (CML) differential transistor pair coupled to a differential output port and configured to receive a differential analog input signal, and to track the differential analog input signal when activated;
   a cross-coupled transistor pair coupled to the differential output port and configured to generate digital output bits corresponding to the differential analog input signal when activated;
   a clock-enable transistor pair configured to receive a differential clock signal, to activate the CML differential transistor pair and deactivate the cross-coupled transistor pair during a first half of a clock cycle of the differential clock signal, and to deactivate the CML differential transistor pair and activate the cross-coupled transistor pair during a second half of the clock cycle of the differential clock signal; and
   a tunable resistor coupled to the differential output port and comprising a clocked CMOS resistor and first and second active inductors, the tunable resistor being configured to receive the differential clock signal, to provide a first load impedance during the first half of the clock cycle, and to provide a second load impedance during the second half of the clock cycle, the first load impedance being lower than the second load impedance,
   wherein the clocked CMOS resistor comprises first and second output transistors coupled between a first voltage source and the differential output port, gate electrodes of the first and second output transistors receiving the differential clock signal, wherein the first and second transistors are configured to provide a third impedance during the first half of the clock cycle and to provide a fourth impedance during the second half of the clock cycle,
   wherein each of the first active inductors comprising:
      an active transistor coupled between a first voltage source and the differential output port;
      a diode-connected transistor; and
      a current source,
      wherein the diode-connected transistor and the current source are configured to maintain the active transistor in an active state such that the first active inductor provides a clock-independent impedance throughout the first and second half of the clock cycle, and
   wherein the first load impedance is a cumulative resistance of the third impedance and the clock-independent impedance, and the second load impedance is a cumulative resistance of the fourth impedance and the clock-independent impedance.

* * * * *